(12) United States Patent
Smallhorn

(10) Patent No.: US 6,572,054 B1
(45) Date of Patent: Jun. 3, 2003

(54) UNDER FLOOR AIR COOLED HOUSING SYSTEM FOR AIRCRAFT PASSENGER DIGITAL SYSTEM ENTERTAINMENT BOXES AND THE LIKE

(75) Inventor: George R. Smallhorn, Montreal (CA)

(73) Assignee: Inflight Canada, Inc., St. Laurent (CA)

( * ) Notice: Subject to any disclaimer, the term of this patent is extended or adjusted under 35 U.S.C. 154(b) by 0 days.

(21) Appl. No.: 10/021,206

(22) Filed: Dec. 7, 2001

(51) Int. Cl.⁷ ................................................. B64C 1/00
(52) U.S. Cl. ................. 244/119; 244/117 R; 244/118.6
(58) Field of Search .......................... 244/118.1, 118.2, 244/118.5, 118.6, 119, 125, 131, 904, 117; 165/3, 41, 1, 46; 454/2, 358; 296/63, 64, 65.13, 191, 203, 204, 208

(56) References Cited

U.S. PATENT DOCUMENTS

| | | | | |
|---|---|---|---|---|
| 4,763,360 A | * | 8/1988 | Daniels et al. | 455/3.06 |
| 4,853,555 A | * | 8/1989 | Wheat | 307/9.1 |
| 5,409,186 A | * | 4/1995 | Chow | 244/122 R |
| 5,795,018 A | * | 8/1998 | Schumacher et al. | 297/184.17 |
| 5,984,415 A | * | 11/1999 | Schumacher et al. | 297/411.2 |
| 6,058,288 A | * | 5/2000 | Reed et al. | 455/3.06 |
| 6,177,887 B1 | * | 1/2001 | Jerome | 340/5.9 |

* cited by examiner

Primary Examiner—Charles T. Jordan
Assistant Examiner—Stephen A. Holzen (57) ABSTRACT

An under floor housing system for a passenger seat electronic units within an aircraft, where the aircraft includes a passenger cabin with a floor supporting the passenger seats and an air circulation system. Conventionally such electronic units are shoe box sized metal boxes hung under the passenger seats exposing them to damage, occupying valuable cabin space, and impeding access for servicing. The individual passenger seat electronic units are connected to a master control and communicate via conduits to a passenger interface accessible from an associated passenger sea. The units and interface are capable of providing passenger services such as: audio entertainment; video entertainment; telephone; intercom; television; video games; Internet; email; and electrical power supply for laptop computers. The under floor housing system has several individual housings recessed beneath the floor surface adjacent the passenger seats. Each housing has: a removable top cover; side walls; and a bottom wall defining an interior compartment. An air cooling fan with temperature sensor is provided for cooling each electronic unit within the interior compartment of each housing with an intake and outlet in communication with the passenger cabin air circulation system. As a result, (1) the service life of the electronic units is increased due to controlled temperature operation, (2) the electronic units are more accessible for service or replacement, (3) passenger cabin space is conserved, and (4) passengers and electronics are separated reducing the risk of injury or equipment damage.

12 Claims, 9 Drawing Sheets

UNDER FLOOR AIR COOLED HOUSING SYSTEM FOR AIRCRAFT PASSENGER DIGITAL SYSTEM ENTERTAINMENT BOXES AND THE LIKE

TECHNICAL FIELD

The invention relates to an under floor air cooled housing system for aircraft passenger electronics units such as digital system entertainment boxes (DSEB unit), in particular a system that enables retrofit relocation of existing units from under passenger seats to an air cooled protective under floor housing for improved duty life and easy access for servicing.

BACKGROUND OF THE ART

The passenger cabins of aircraft are intended to provide maximum safety and comfort for passengers. An increasingly important component is the provision of passenger entertainment systems, mobile telephone services and laptop computer connectivity. Passengers are required to remain seated for extended periods of time and airlines plan to provide audio and video entertainment, telephone, intercom, television, video games, internet, email and electrical power supply for laptop computers, especially in business class and first class areas to permit passengers to work during the flight, communicate or seek entertainment. For optimum safety, the passenger should remain seated with safety belt fastened at all times during flight.

The airlines have responded to passenger's expectations and attempted to improve passenger service by providing such entertainment and communication services in existing aircraft and in new aircraft as they are purchased. Due to the confines of existing aircraft cabins and seating arrangements, it has been considered necessary to fit passenger seat units with digital system entertainment boxes that are currently mounted to the seat legs under the seat. A conventional aircraft passenger seat is supported in single, double, triple or multiple seat units on a metal frame with legs that are secured within a seat track that can be adjusted for different seating pitch dimensions. Beneath the passenger seat, the area provided for carry on luggage has been reduced by the installation of digital system entertainment boxes. Conventional digital system entertainment boxes are approximately the size of a shoe box and can serve up to three separate passenger seats from a single unit located under one of the seats within the area provided for carryon hand luggage.

The conventional location of these bulky digital system entertainment boxes in the under seat hand luggage area has several disadvantages. Apart from reducing the area within the passenger cabin for hand luggage and the passenger's feet, the installation of electrical equipment near passengers subjects the passenger to a risk of injury and potential electrical shock, as well as exposing the electrical equipment to potential accidental impact damage, vandalism and beverages served within the passenger cabin. The electrical boxes interfere with cleaning of the passenger cabin and electronic units are exposed to potential damage from vacuum cleaners and cleaning solvents used during the cleaning of carpets and passenger seats.

The conventional under seat location also makes maintenance and inspection very difficult. For example, replacing an under seat digital system entertainment box takes approximately one hour due to its inconvenient location. All electrical equipment generates heat and in order to extend the duty service life of electrical equipment, temperature control and cooling is generally preferred. However, when electrical equipment is located under the seat of a passenger cabin, use of cooling fans is impractical due to the noise level generated and risk of accidental contact. In addition, close proximity to a floor in a high traffic area with carpets and upholstery generates significant amounts of lint and dust that could be sucked into any air cooled electrical equipment by fans thereby requiring frequent cleaning. As a result, cooling is generally not provided and under seat electrical components are inadequately cooled while their service life is decreased due to temperature variations and increased heat concentration.

Therefore, at best the current configuration of digital system entertainment boxes in aircraft passenger cabins is a make shift attempt to provide an increased level of passenger services at minimum cost and minimal disruption to the passenger cabin environment. However, as a long-term solution, the provision of relatively large electrical boxes under the seats of passenger cabins suffers from several disadvantages. As demand for increased passenger entertainment, communication and work related services appears inevitable, the number and complexity of such passenger service electronics will increase dramatically.

It is an object of the present invention to rationalize the configuration of passenger service electronics within the passenger cabin and store such electrical components safely away from all interference with the passenger, carryon luggage as well as food and beverage service within the cabin.

It is a further object of the invention to provide adequate temperate control and cooling for the passenger electronic components within a clean controlled environment to extend the duty service life of electrical components.

It is a further object of the invention to minimize the expense and down time required to modify existing aircraft equipment by retrofitting existing airlines cabins and relocating existing passenger electronic components without requiring extensive modification to the aircraft or requiring the aircraft to be grounded for extended periods of time.

It is a further object of the invention to provide temperature control and monitoring for passenger electronic components utilising the existing passenger cabin air circulation and air conditioning system without requiring the expense and added weight of a separate dedicated cooling system.

Further objects of the invention will be apparent from review of the disclosure, drawings and description of the invention below.

DISCLOSURE OF THE INVENTION

The invention provides an under floor housing system for a passenger seat electronic units within an aircraft, where the aircraft typically includes a passenger cabin with a floor supporting the passenger seats and includes an air circulation system.

Conventionally such electronic units are shoebox sized metal boxes hung under the passenger seats where the location exposes electronics to damage, occupies valuable cabin space, and complicates access for servicing. The individual passenger seat electronic units are connected to a master control and communicate via individual cables to a passenger interface accessible from an associated passenger sea. The units and interface are currently capable of or will soon be adapted for providing passenger services such as: audio entertainment; video entertainment; telephone; intercom; television; video games; internet access; email; and electrical power supply for laptop computers.

The under floor housing system has several individual housings recessed beneath the floor surface adjacent the passenger seats. Each housing has a removable top cover, side walls, and a bottom wall defining an interior compartment. An air-cooling fan with temperature sensor is provided for cooling each electronic unit within the interior compartment of each housing with an intake and outlet in communication with the passenger cabin air circulation system.

By providing a separate recessed housing beneath the floor surface, numerous advantages over the conventional under seat location for electronic passenger units are achieved.

The service life of electronic units is increased dramatically due to the control of temperature during operation. The cooling fans operate in conjunction with the air circulation flow within the fuselage which generally draws air from the passenger cabin to exit the cabin through louvers in the cabin side walls adjacent the floor and then proceeds in the lower lobe of the fuselage to vent about 50% and recirculate the remaining 50% with fresh compressed air from the engine compressors. Therefore positioning of recessed housings with air cooling fans under the floor draws in spent air that has exited the cabin and does not increase the heat input into the cabin. As well, the air cooled under floor housings do not require a dedicated air supply nor separate air coolers since the air conditioning system of the cabin has sufficient capacity and directs air flow to the under floor area of the fuselage.

By clustering existing electronic units within the under floor recessed housing, the electronics units are more easily accessible for service, inspection and replacement by maintenance personnel. For example, in an under seat location replacement of a defective unit requires approximately one hour of maintenance personnel time whereas the increased accessibility and visibility of cluster units in the recessed under floor housing makes replacement of a defective unit a simple matter of releasing the defective unit from the housing and reconnecting within five or ten minutes. The under floor housing includes a spring loaded latch and mounting brackets that permit quick release of the electronic units for servicing. The enclosure of units within the housing with a secure locked top cover reduces any danger to passengers.

Compared with the conventional under seat location, the recessed under floor housing conserves valuable passenger cabin space for carry-on luggage. The cabin area remains available for passenger needs and is less cluttered for security inspections, cleaning and maintenance. As well, passengers and electric powered components are separated thereby reducing the risk of passenger injury and damage to the equipment from passengers, their luggage or food and beverage served in the passenger cabin. Intentional vandalism by passengers is eliminated entirely by hiding the electrical units in the under floor housing.

A significant advantage of the invention is the ability to relocate or retrofit existing electronic components in existing aircraft. The units can be removed from their current location under seats and relocated in an under floor cluster within the housing. No changes need to be introduced in the functional capabilities of existing electronic components. The cabling from master control to each unit in the housing and cabling from the units to the passenger seats is reinstalled due to the different lengths and configuration of cables.

Increased control over the temperature of operation is provided by positive airflow through the underflow housings and temperature sensors. The sensor alert flight crew through displays on a control panel in the event of any malfunction.

Airlines can more easily add electronically delivered passenger services to relatively crowded economy sections of the cabin since bulky electronic components can be stored in the under floor air cooled housings rather than in conventional under seat locations. The economy cabins have less space available for storing additional electronics boxes under the seats creating a lack of space for passenger's feet and carry on luggage.

A further less obvious advantage however is the ability to easily upgrade passenger electronic units by replacing existing digital system entertainment boxes in existing aircraft as the technology evolves and passenger service increase. For example, currently four seat passenger seating arrays are served by two digital system entertainment boxes since current digital system entertainment boxes are only capable of serving up to three separate passenger seats. By clustering the passenger electronics in an under floor housing, new higher capacity equipment can be provided sufficient to serve four or more seats if desired, without much concern over the additional size of the new equipment. Further in the future, the existing cluster of three or four separate digital system entertainment boxes may be replaced by a rationalized system that uses a single power supply resulting in a much smaller combined unit. Further in the future, it may be possible to provide an entirely new electronic system, which includes its own power supply and modem board with PC card to serve twelve or more seats from a single unit. The improved access for maintenance and servicing in housings under the floor, and grouping of units in clusters will make future upgrades easier and quicker to implement. An aircraft that is grounded for maintenance, is not earning revenue and a quick turnaround is critical in deciding to implement an upgrade.

In addition, since it is necessary in a retrofit to remove and replace several floor panels, the invention can easily provide for a recessed cable raceway in floor panels adjacent to the seat tracks to route conduits and cables to individual seats in a recessed raceway. The advantage of a recessed raceway is that existing plastic seat track cover strips can be eliminated and the entire cabin floor can be provided with a flat flush surface. Existing seat track cover strips enclose cables beneath them and rise above the carpeted floor level as a result. Plastic seat track covers are sometimes referred to as "speed bumps" due to their appearance and impedance of pedestrian traffic. Use of a recessed cable raceway and flush carpeted floor over the cables and seat track removes a tripping hazard, simplifies cleaning of the floor surface, reduces maintenance of the floor surface and improves the visual appeal of the passenger cabin.

DESCRIPTION OF THE DRAWINGS

In order that the invention may be readily understood, one embodiment of the invention is illustrated by way of example in the accompanying drawings.

Further details of the invention and its advantages will be apparent from the detailed description included below.

DETAILED DESCRIPTION OF PREFERRED EMBODIMENTS

Figure 1:
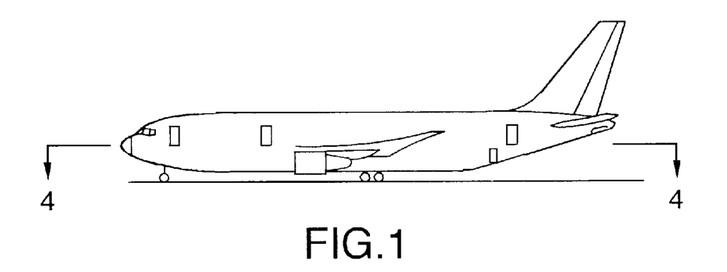
FIG. 1 shows a side view of a typical passenger aircraft to orient the following sectional views.
Figure 2:
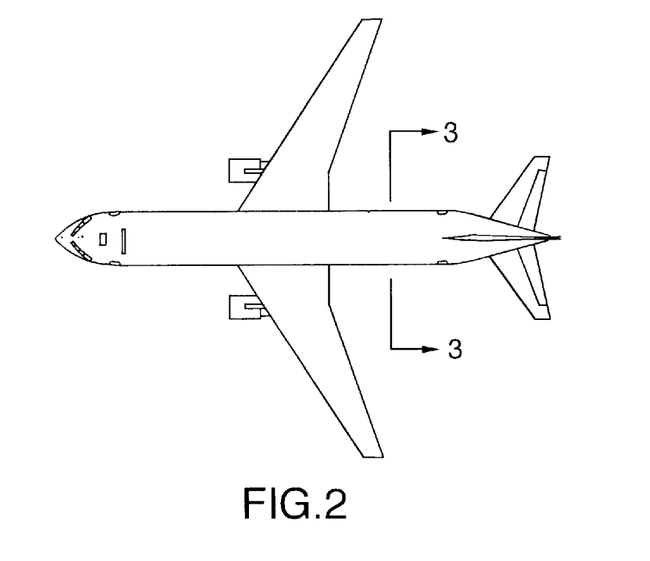
FIG. 2 shows a top plan view of the aircraft for the same reason.
Figure 3:
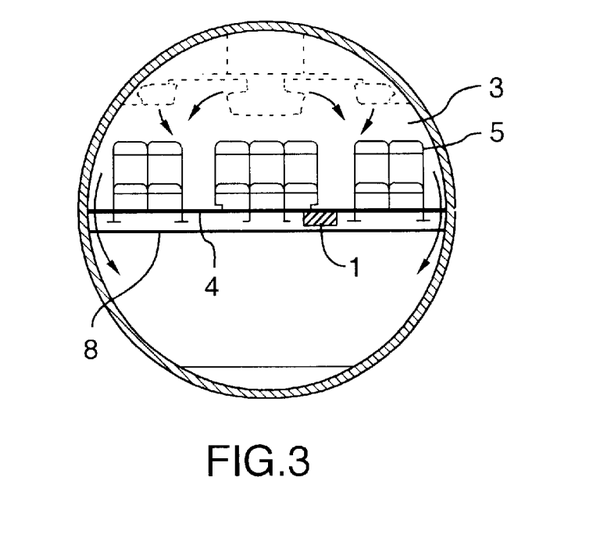
FIG. 3 shows a sectional view along line 3—3 of FIG. 2 indicating the orientation of the passenger cabin floor and a typical seating arrangement.
Figure 4:
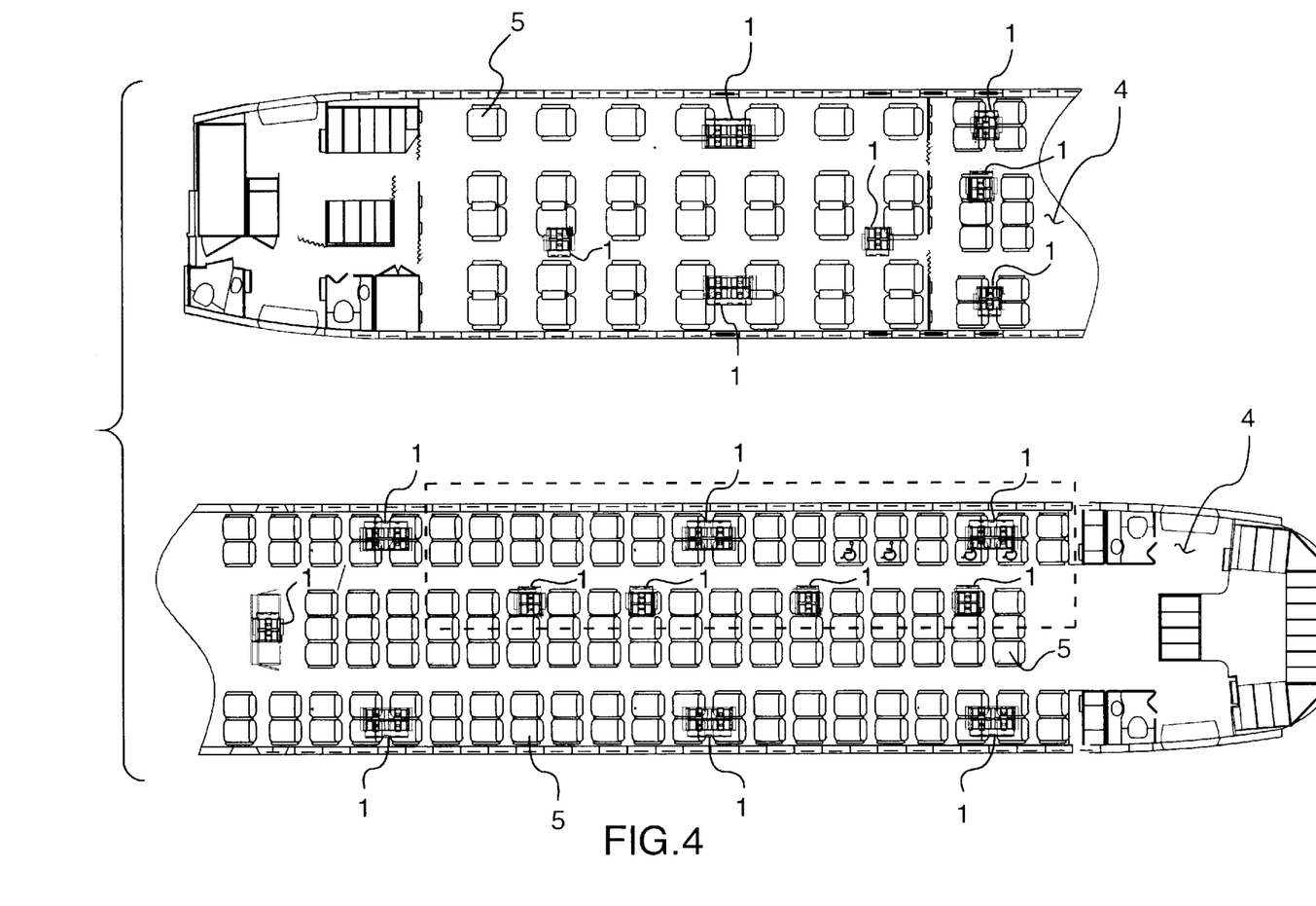
FIG. 4 is a sectional view alone line 4—4 of FIG. 1 showing the passenger cabin floor plan and seating arrangement typically found in a wide body aircraft, and in particular showing the location of various under floor recessed housings providing air cooled accommodation for clusters of existing passenger electronic units that are relocated from their conventional under seat location to their under floor air cooled housing.

As mentioned above, FIGS. 1 and 2 are provided to orient the reader in quickly understanding the sectional view FIG. 3 and the floor plan of FIG. 4. A conventional aircraft passenger cabin floor 4, as indicated in FIG. 3, is supported on transverse floor beams 8 that in turn support longitudinal floor joists 10 with seat tracks 11 in their top flanges wherein seat legs can slide longitudinally and are locked in various seat pitch patterns as desired.

Pressurized air for the passenger cabin 3 comes from compressor stages in the aircraft engines. A portion of the hot compressed air is drawn off from the engine and passed through heat exchangers, then further cooled by air conditioning units under the floor 4 of the cabin 3. Cooled air flows into a mixing chamber where is mixed with an approximately equal amount of filtered air from the passenger cabin, then ducted and distributed via overhead louver outlets. Within the cabin 3, the airflow is generally circular and exits through floor grills on either side of the cabin 3 into the lower cargo portion of the fuselage. Generally, one half of the air from the cabin is exhausted through an overflow valve, which also controls cabin pressure and provides air changeover. The other half of the air is filtered and mixed with incoming compressed air from the engine. As shown in FIG. 3, the positioning of the under floor recessed housing 1 utilizes spent air flow that has exited from the cabin 3. Any heat exchanged to the air used for cooling the housing 1 is not directed towards passengers but rather is directed to the air makeup/exhaust/reconditioning portion of the conventional aircraft air circulation system.

Figure 5:
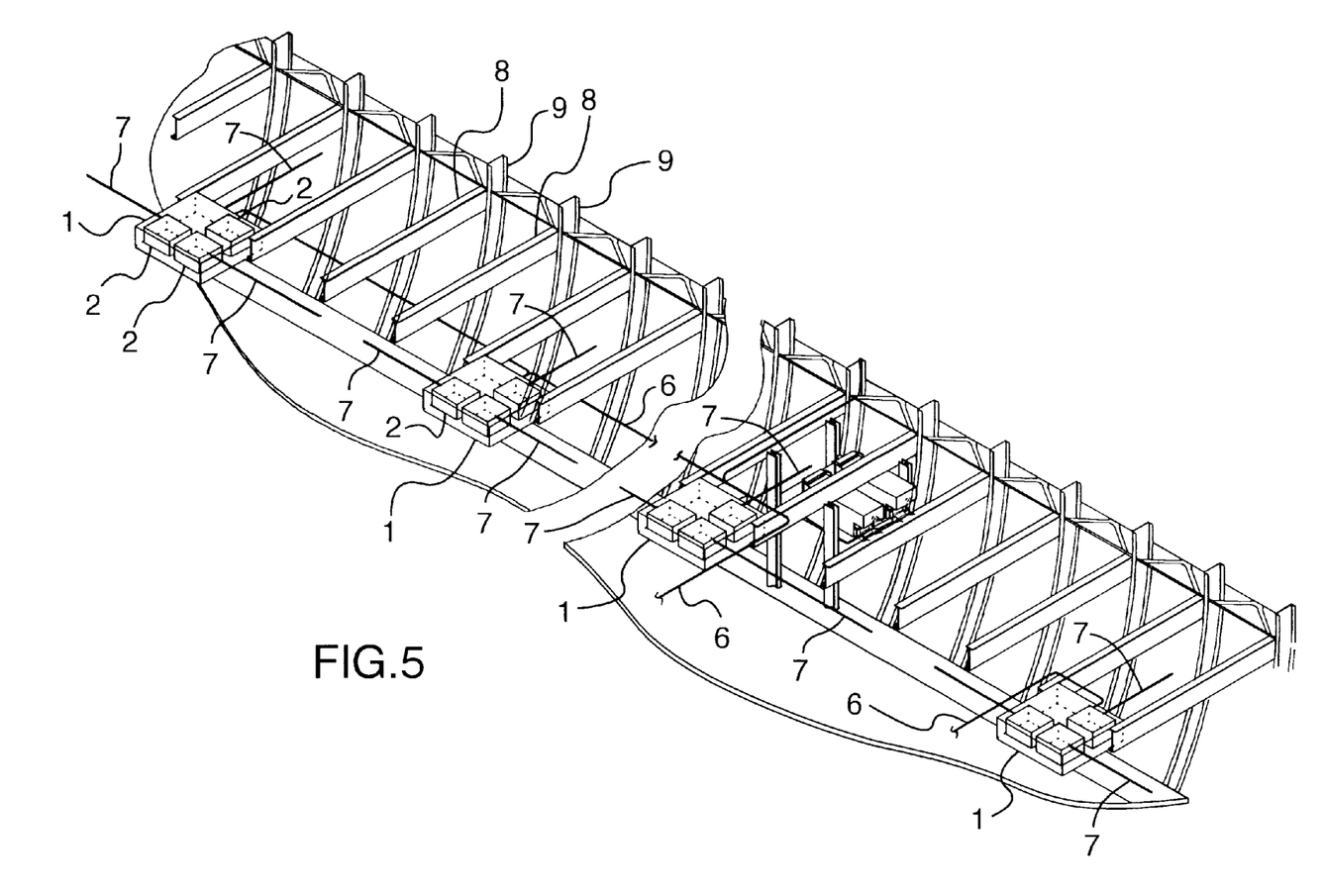
FIG. 5 is a partial perspective view of the aircraft floor structure with floor panels removed to show transverse floor beams and in particular to show an example of four individual under floor housings each including three individual passenger electronic units, with additional space for a fourth unit.
Figure 6:
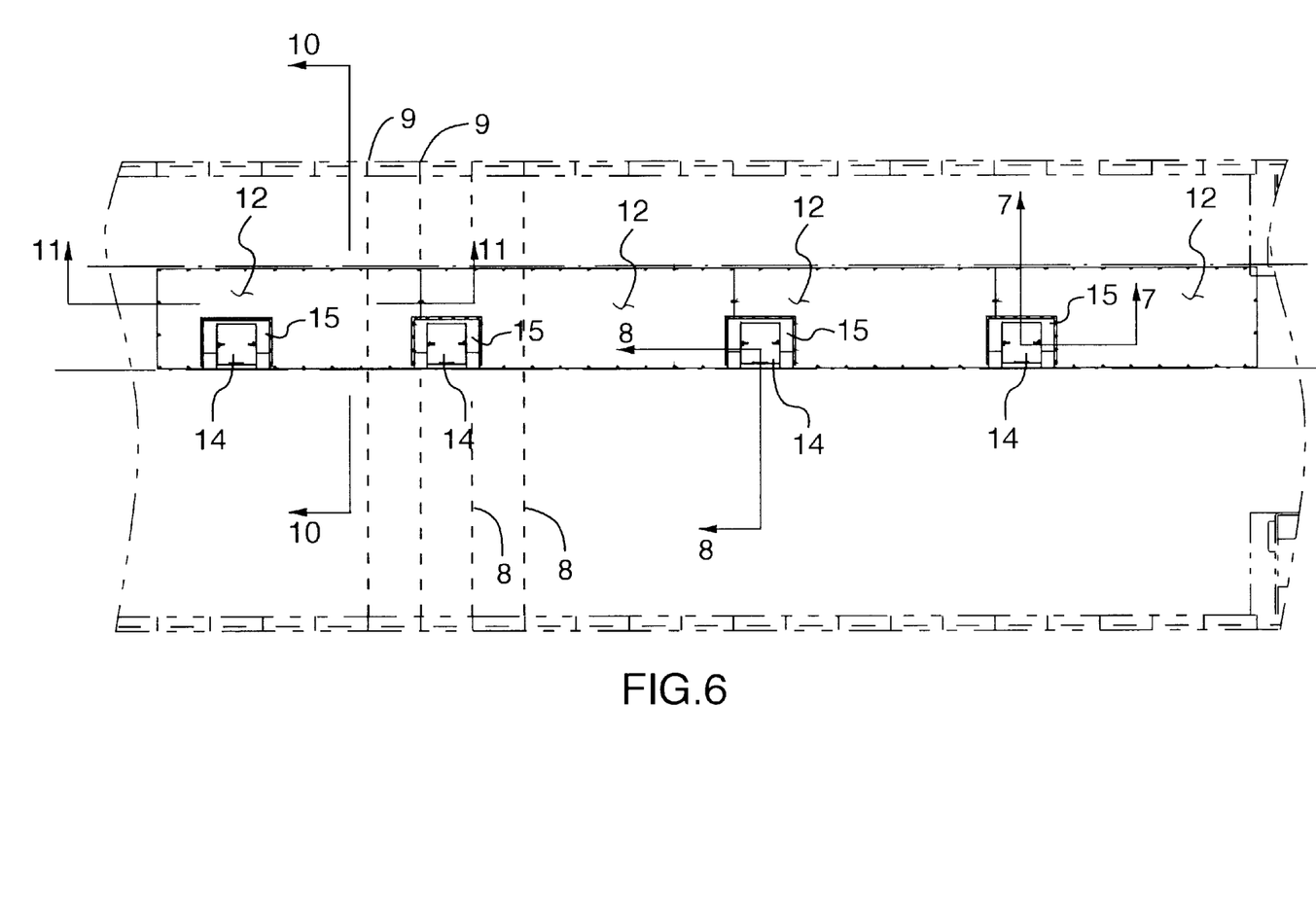
FIG. 6 is plan view of a portion of the passenger cabin floor (as in FIG. 5) with modified floor panels, removable top cover on four under floor housings and access cover frames surrounding the removable cover to support it on the existing transverse beams and provide support for adjacent floor panels.

FIG. 4 shows a floor plan of a conventional wide body aircraft with different seat arrangement in the forward first class/business class forward portion and closer seat pitch in the rearward economy class area. In both cases, individual passenger seat electronic units have been removed from their conventional locations under the seat units and relocated in clusters in recessed under floor housings 1. For simplicity of the description, FIGS. 5 and 6 show only a small portion of the cabin floor that includes four individual recessed housings 1 in the area indicated in FIG. 4 with dashed outline.

Therefore, according to the invention the under floor housing system provides for new installation or for relocation and replacement of existing or new passenger seat electronic units 2 within the aircraft. In general, the aircraft includes a passenger cabin 3 with a floor structure 4 supporting an array of passenger seats 5 either in individual units, double or triple units and up to five seats 5 in an array. Each individual seat unit or multiple unit having seat legs secured within the seat tracks 11 longitudinally extending throughout the aircraft cabin floor 4.

The individual passenger seat electronic units 2 are each connected to the aircraft master control via conduit 6 (shown in FIG. 5) and communicate with cables 7 (shown in FIGS. 5, 15 and 16) through a passenger interface accessible from an associated passenger seat 5.

As mentioned above, the passenger seat electronic units 2 or digital system electronic boxes are currently provided or in the future can provide a variety of passenger services such as audio entertainment, video entertainment, mobile telephone and intercom voice communication, television, video games, internet, email, and electrical power supply for laptop computers and the like.

According to the invention, the under floor housing system includes a number of individual air cooled housings 1 recessed beneath the floor surface 4 adjacent to the passenger seats 5 for example as shown in FIG. 4.

As indicated in FIGS. 5, 10, 11, 15 and 16, the floor 4 is built up from a series of spaced apart transverse floor beams 8 that span across oval hoops 9 which form the structural frame work for the aircraft fuselage. The generally floor beam 8 arrangement is best seen in the FIG. 5 perspective view. As also shown in the perspective view of FIG. 15, the extruded aluminium alloy transverse beams 8 in turn support longitudinal joists 10 which are extruded aluminium sections including a seat track 11 in the top flange of the joist 10. The top flange of the beams 8 and joists 10 are assembled in a common plane to provide a flat rectangular grillwork into which individual floor panels 12 are removably secured with countersunk bolts 13 (as best seen for example in the sectional views of FIGS. 10 and 11).

FIG. 6 shows retrofit installation of four air cooled recessed housings 1 in an example arrangement where the original rectangular floor board units are removed. Floor boards are replaced with floor panels 12 that have custom rectangular cut outs to accommodate the recessed housing 1 and the associated access cover frame 15 surrounding the removable top cover 14, the details of which are described below.

Therefore where existing digital system entertainment boxes or other passenger electronics are to be relocated in the under floor cluster within the recessed housing 1, signals and power are provided to the digital system entertainment boxes from the master control via cables 6 and new cables 7 are installed through recessed raceways 30 (see FIGS. 15, 16) between the recessed housing 1 and each individual passenger seat 5.

Figure 7:
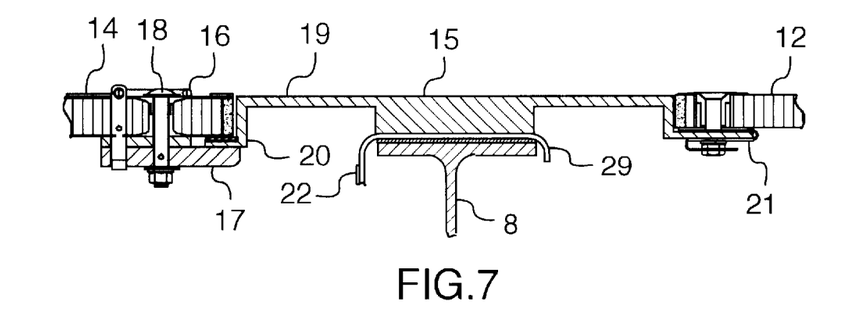
FIG. 7 is a sectional view through the removable cover, rotatable locking plate and adjacent portion of the access cover frame.
Figure 8:
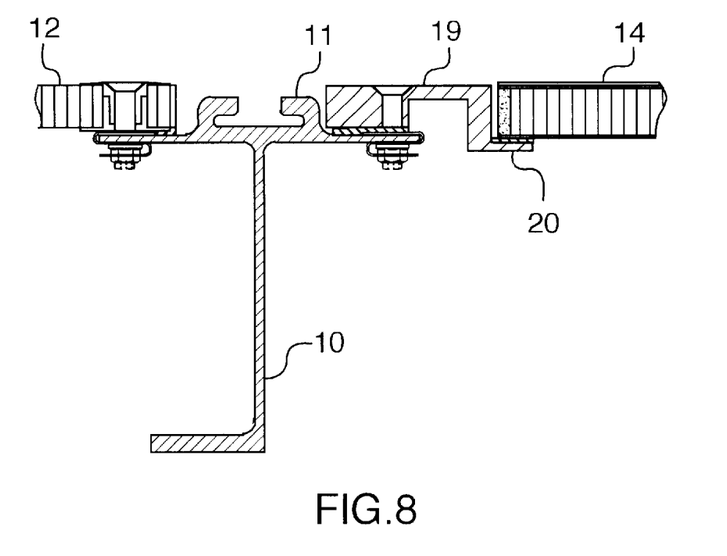
FIG. 8 is a sectional view through the joist with top flange seat track, portion of the access cover frame supporting the cover.
Figure 9:
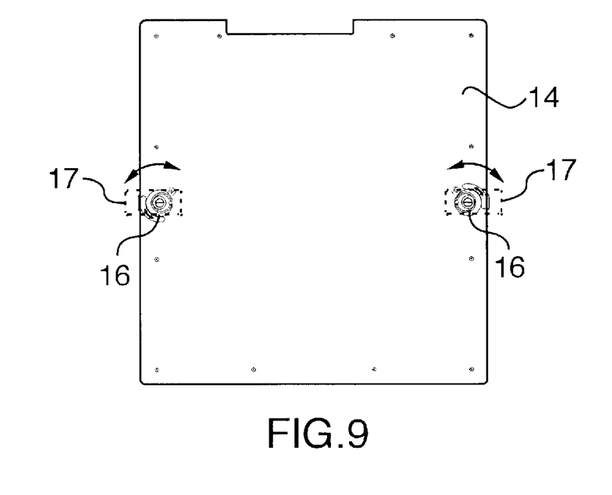
FIG. 9 is a plan view of the removable cover for the recessed housing, showing two rotatable locking plate mechanisms (that hold the cover within the access cover frame as seen in the left portion of FIG. 7).
Figure 10:
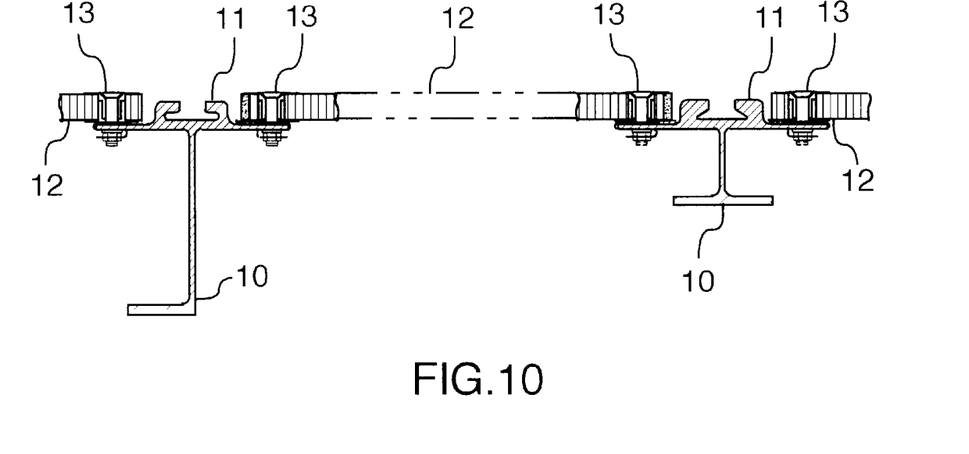
FIG. 10 is a sectional view, along line 10—10 of FIG. 6, showing a section view through the floor panel, which is bolted to the top flange of the adjacent longitudinal floor joist with removable countersunk bolts.
Figure 11:
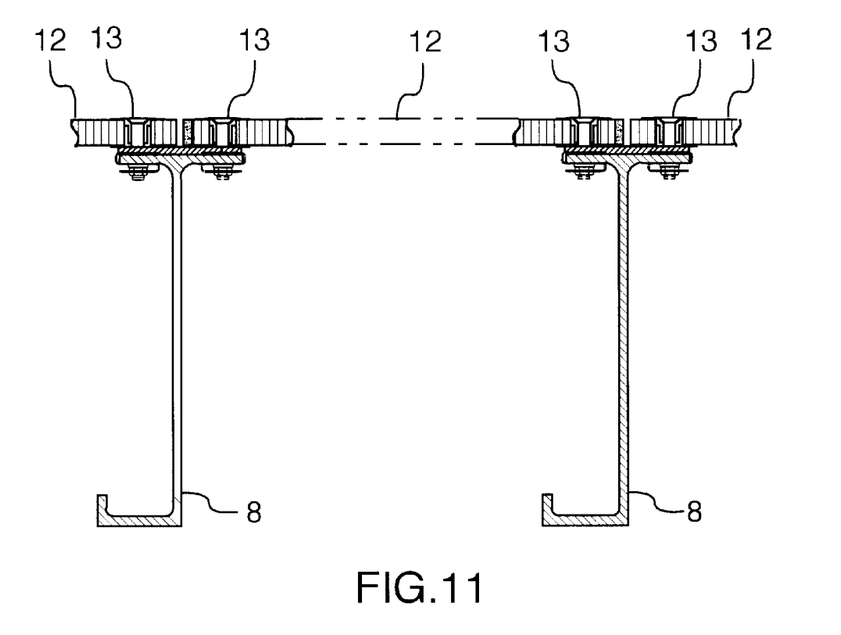
FIG. 11 is a like sectional view, along section lines 11—11 of FIG. 6, showing sectional view through the floor panel bolted to top flange of two adjacent transverse floor beams.

FIGS. 7, 8 and 9 show the detailed construction of the top cover 14 and surrounding cover frame 15. The cover plate 14 includes two lifting rings 16 and a quarter turn locking mechanism with lock plate 17 that is rotated 90° or one quarter turn with the bolt 18. The access cover frame 15 has peripheral plates 19 that surround and define the cover opening with a recessed lip 20. The adjacent floor panels 12 are supported on a recessed floor panel support plate 21.

Figure 12:
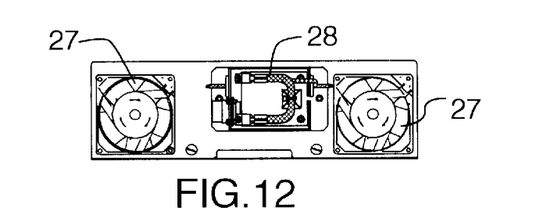
FIG. 12 is a sectional view along line 12—12 of FIG. 13 showing the interior view of the dual fan unit with temperature sensor positioned between the two axial flow fans.
Figure 13:
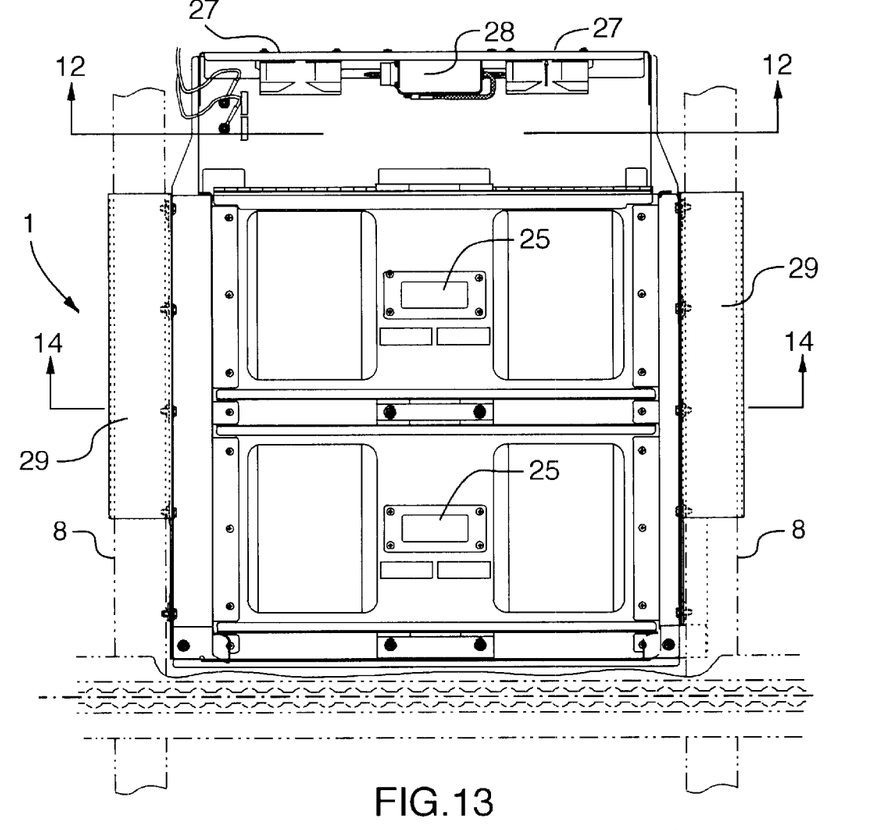
FIG. 13 is a plan view of a recessed under floor housing adapted for housing four existing digital system entertainment boxes that have been relocated from their under seat position and showing details of the transverse beams on which the housing is suspended adjacent a seat track.
Figure 14:
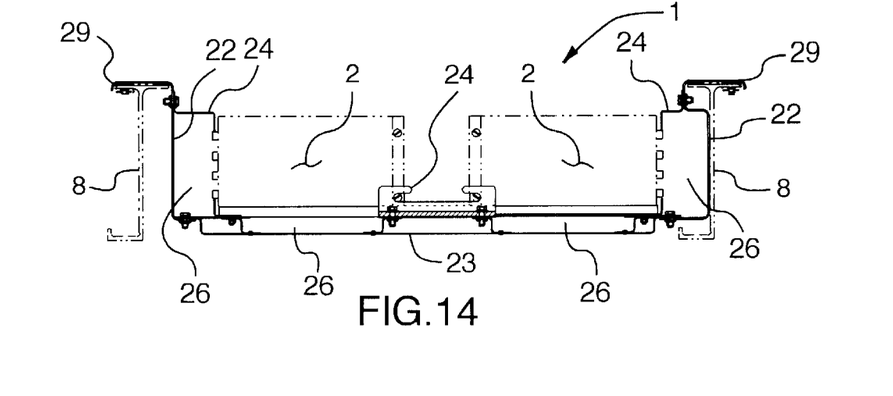
FIG. 14 is a sectional view along line 14—14 of FIG. 13 showing mounting brackets used to mount the four individual digital system entertainment boxes (shown in dashed outline) and to show the provision of air flow channels around the digital system entertainment boxes in line with the air output from the axial flow fans.

FIGS. 12, 13 and 14 show the details of the under floor recessed housing 1 that is suspended on brackets 29 from the adjacent floor beams 8 once the existing floor panels 12 have been removed from the cabin floor 4. The housing 1 is recessed beneath the floor 4 surface adjacent to the passenger seat 5. Each housing in the embodiment shown can accommodate up to four individual digital system entertainment boxes 2 relocated from under the passenger seats into the recessed housing 1. Each housing 1 has a removable top cover 14 and cover frame 15 installed above after the suspended sheet metal tray portion (shown in FIGS. 13 and 14) is installed. The tray portion includes side walls 22 and bottom wall 23 which define an interior compartment with the underside of the cover 14.

Releasable mounting brackets 24, including spring loaded release latch 25, secure the electronic units 2 to the housing 1, as best shown in FIG. 14. The mounting brackets 24 and 25 support the electronic units 2, a predetermined distance from the top cover 14 bottom wall 23 and side walls 22 thereby defining one way airflow channels 26 aligned with the fans 27 to conduct a cooling flow of air through the housing compartment 1. The fans 27 intake air flow that has exited from the passenger cabin 3 (as indicated with arrows in FIG. 1) through side wall air louvers directing air into the under floor compartment. Air from the fans 27 continues the flow pattern of the passenger cabin air circulation system and is not directed into the passenger cabin 3, but continues with the spent airflow to be exhausted or mixed with fresh intake air from the engine compressors after filtering and heat exchange.

The housing 1 also includes a temperature sensor 28 that is also in communication with the master control for the electronic units 2. Cabin crew is alerted by means of alarms or a display when there is a fan malfunctions or temperature in the housing 1 exceeds the desired operating range. Cabin crew can operate the master control to shut down any overheating electronic units 2 within the housing 1 if necessary.

In order to minimize power consumption and reduce noise, the fans 27 are axial flow with low noise feathered blades and are driven by 28 volt DC electrical power. Of course, due to their location underneath a sealed cover plate 14 and considering that the floor panels 12 have sound dampening capability, the minimal additional noise created by the fans 27 does not cause any noise increase in the passenger cabin 3.

As shown in FIGS. 13 and 14, the sheet metal structure of the housing 1 is easily dropped into place supported on the beams 8 from overhead on laterally extending beam flange support brackets 29. As shown in FIG. 7 the mounting bracket 29 is relatively thin sheet metal and is sandwiched between the top flange of the floor beam 8 and the bottom surface of the cover frame 15.

Figure 15:
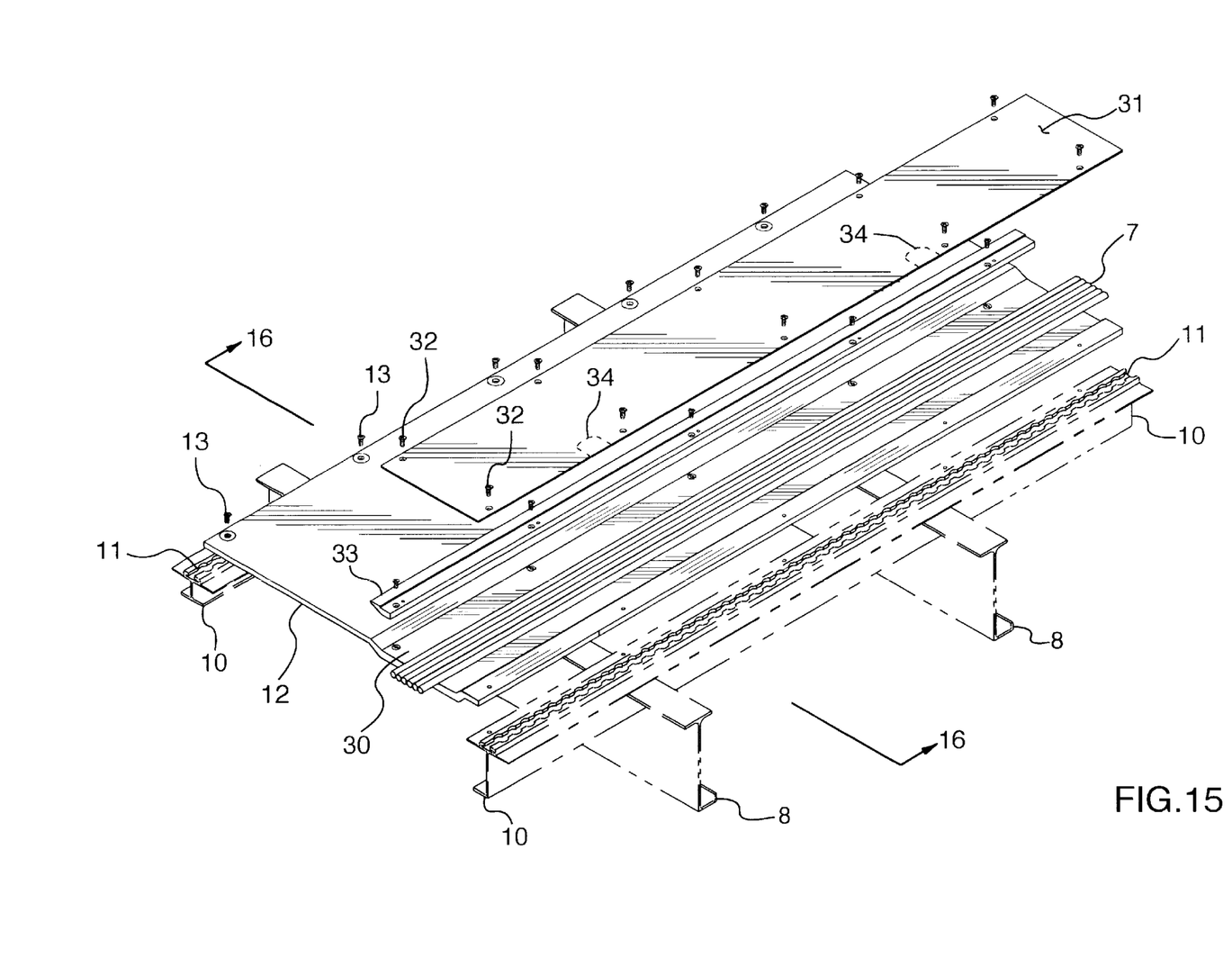
FIG. 15 is an exploded perspective view of a floor panel that includes a recessed cable raceway with removable cap plate for providing a cable raceway between the recessed under floor housing and individual passenger seats units which are secured to the seat track.
Figure 16:
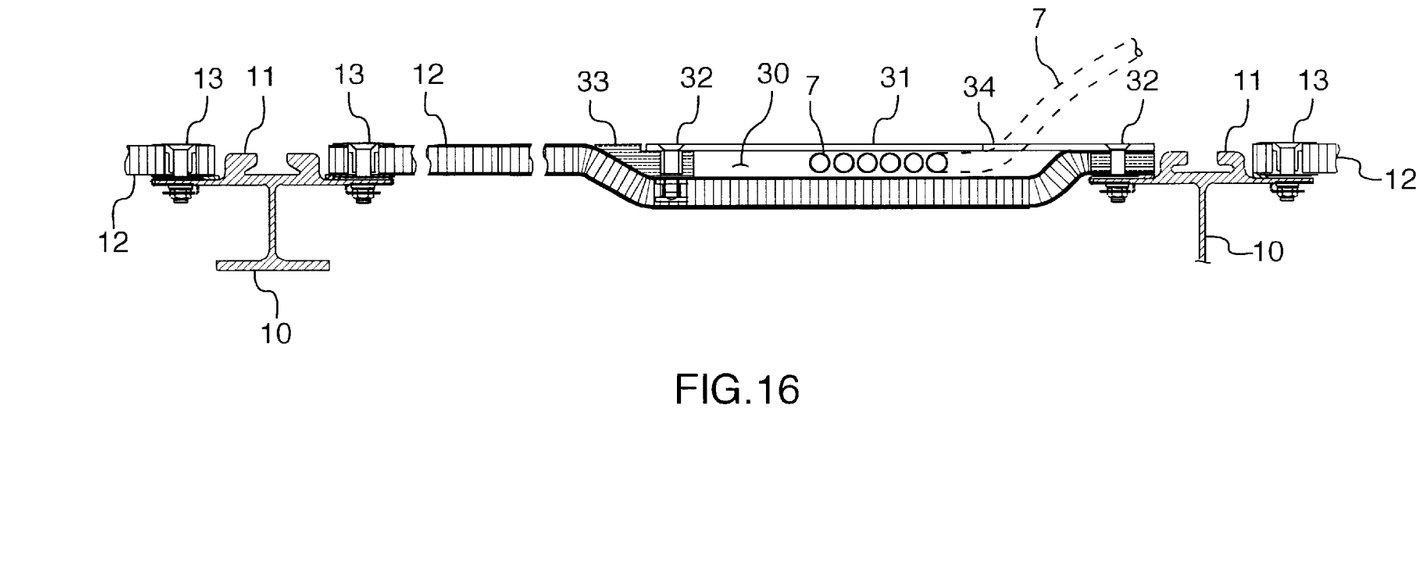
FIG. 16 is a detailed sectional view along line 16—16 of FIG. 15 showing in dashed outline the means by which the top cap plate can be notched to permit passage of cables to individual seats units at any point along the length of the raceway.

Conventionally floor mounted wires and cables are positioned under a plastic seat track cover strip (not shown) that covers the seat tracks 11 and protrudes upwardly from the carpeted cabin floor surface. As shown in FIGS. 15 and 16, the invention preferably includes modified floor panels 12 that have a recessed conduit raceway 30 disposed adjacent to the seat track 11. A removable cap plate 31 is secured with bolts 32 and a filler strip 33. As best seen in FIG. 16, the cap plate 31 and adjacent floor panels 12 have a flush coplanar top surfaces thereby avoiding the discontinuous surface common in conventional aircraft cabin floors. Carpet may be applied over the floor panels 12, cap plate 31 and if desired over open portions of the seat track 11 to provide a completely flat continuous floor surface without impediment.

As indicated in FIG. 5, cables 7 extend from the individual electronic units 2 to each passenger seat 5. In order to pass from the recessed raceway 30 to the passenger seat 5 mounted with legs in the seat track 11, the cap plate 31 includes a lateral notch 34. The notch 34 can be cut easily in the thin sheet metal cap plate 31 with a jigsaw or pre-punched knock out notches 34 can be provided. Since the cap plate 31 is a simple flat plate with drilled holes, it can be treated as a recyclable item that can be replaced if the seat pitch on the aircraft is repeatedly changed and numerous notches 34 are made in the cap plate 31.

Therefore, as described in detail above, the invention provides an integrated system for retrofitting existing digital system entertainment boxes 2 from under passenger seats 5 to a recessed under floor housing 1 together with a recessed raceway 30. the invention provides a completely flat floor area and removes electronic components 2 from the passenger cabin area 3 while providing improved circulation to cool the electronic components 2 and extend their service life significantly. In addition, the recessed housing 1 and recessed raceway 30 provides improved access for maintenance and inspection as well as temperature sensors 28 to monitor any malfunctioning units 2.

Although the above description relates to a specific preferred embodiment as presently contemplated by the inventor, it will be understood that the invention in its broad aspect includes mechanical and functional equivalents of the elements described herein.

I claim:

1. An under floor housing system for a plurality of passenger seat electronic units within an aircraft, the aircraft including a passenger cabin with a floor supporting a plurality of passenger seats, the passenger cabin having an air circulation system;

the individual passenger seat electronic units each being connected to a master control and communicating via at least one conduit to a passenger interface accessible from an associated passenger seat, the units and interface capable of providing passenger services selected from the group consisting of: audio entertainment; video entertainment; telephone; intercom; television; video games; internet; email; and electrical power supply, the under floor housing system comprising:

at least one housing recessed beneath the floor surface adjacent the passenger seats, each housing having: a removable top cover; side walls; and a bottom wall defining an interior compartment; and air cooling means, for cooling each electronic unit within the interior compartment of each housing, the air cooling means comprising a fan with an intake and outlet in communication with the passenger cabin air circulation system.

2. An under floor housing system according to claim 1 wherein each housing includes a temperature sensor in communication with the master control.

3. An under floor housing system according to claim 1 wherein the fan is axial flow with feathered blades.

4. An under floor housing system according to claim 1 wherein the fan is driven by 28 volt DC electric power.

5. An under floor housing system according to claim 1 wherein each housing includes releasable mounting brackets for mounting the passenger seat electronic units.

6. An under floor housing system according to claim 5 wherein the mounting brackets include a spring loaded release latch.

7. An under floor housing system according to claim 5 wherein the mounting brackets support the electronic units a predetermined distance from the top cover, bottom and side walls thereby defining one way air flow channels aligned with the fan through the housing compartment.

8. An under floor housing system according to claim 1, wherein the aircraft cabin floor comprises: a plurality of spaced apart transverse floor beams with a top beam flange: a plurality of longitudinal joists supported by the transverse floor beams, each joist having a seat support track in a top joist flange thereof; and a plurality of floor panels mounted to at least one of the flanges;

the side walls of the housing including a laterally extending beam flange saddle mounting bracket.

9. An under floor housing system according to claim 1 wherein the housing includes an access cover frame having peripheral plates defining a cover opening, at least one peripheral plate including a laterally extending floor panel support plate.

10. An under floor housing system according to claim 1, wherein the aircraft cabin floor comprises: a plurality of spaced apart transverse floor beams with a top beam flange: a plurality of longitudinal joists supported by the transverse floor beams, each joist having a seat support track in a top joist flange thereof; and a plurality of floor panels mounted to at least one of the flanges, and wherein the under floor housing system includes:

a recessed conduit raceway within a floor panel disposed adjacent a seat track, the raceway having a removable cap plate.

11. An under floor housing system according to claim 10, wherein the cap plate and floor panels have a flush top surface.

12. An under floor housing system according to claim 10 wherein the cap plate includes a lateral conduit passage notch.

* * * * *